United States Patent
Cheng et al.

(10) Patent No.: US 7,638,391 B2
(45) Date of Patent: Dec. 29, 2009

(54) SEMICONDUCTOR MEMORY DEVICE AND FABRICATION METHOD THEREOF

(75) Inventors: Chien-Li Cheng, Taoyuan County (TW); Shian-Jyh Lin, Taoyuan County (TW); Ming-Yuan Huang, Taoyuan County (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 58 days.

(21) Appl. No.: 11/951,270

(22) Filed: Dec. 5, 2007

(65) Prior Publication Data

US 2009/0026516 A1    Jan. 29, 2009

(30) Foreign Application Priority Data

Jul. 24, 2007    (TW) .............................. 96126902 A

(51) Int. Cl.
*H01L 21/8242*    (2006.01)
*H01L 27/108*    (2006.01)

(52) U.S. Cl. .................. 438/243; 438/246; 257/301; 257/E29.346; 257/E21.681; 257/E21.647

(58) Field of Classification Search ................ 438/243, 438/246; 257/301, E21.651, E29.346, E21.647
See application file for complete search history.

(56) References Cited

U.S. PATENT DOCUMENTS

| | | | | |
|---|---|---|---|---|
| 6,472,702 B1 * | 10/2002 | Shen | ........................... | 257/301 |
| 6,479,852 B1 * | 11/2002 | Wu | ............................. | 257/301 |
| 2002/0090828 A1 * | 7/2002 | Chern et al. | ................. | 438/720 |

* cited by examiner

*Primary Examiner*—Caridad M Everhart
(74) *Attorney, Agent, or Firm*—Winston Hsu

(57) ABSTRACT

A method for fabricating a semiconductor memory device. A pair of neighboring trench capacitors is formed in a substrate. An insulating layer having a pair of connecting structures therein is formed on the substrate, in which the pair of connecting structures is electrically connected to the pair of neighboring trench capacitors. An active layer is formed on the insulating layer between the pair of connecting structures so as to cover the pair of connecting structures. A pair of gate structures is formed on the active layer to electrically connect to the pair of trench capacitors. A semiconductor memory device is also disclosed.

18 Claims, 5 Drawing Sheets

SEMICONDUCTOR MEMORY DEVICE AND FABRICATION METHOD THEREOF

BACKGROUND OF THE INVENTION

1. Field of the Invention

The present invention relates to semiconductor technology and in particular, to a semiconductor memory device and a fabrication method thereof.

2. Description of the Related Art

In the rapidly evolving integrated circuit industry, the developmental trend is toward high performance, miniaturization, and high operating speeds. Accordingly, dynamic random access memory (DRAM) fabrication methods have developed rapidly. In particular, increasing large memory capacity is important for DRAMs. Typically, DRAM cells include a transistor and a capacitor. With DRAM capacity reaching 512 MB, the size of memory cells and transistors have shrunk to meet demands for higher integration, higher memory capacity and higher operating speeds. For conventional planar capacitor technology however, relatively more useable surface area on an integrated circuit is required, thus making it difficult to meet the previously mentioned demands. Accordingly, three dimensional (3-D) technology, such as deep trench capacitor technology, has been applied to DRAM fabrication with the goal of reducing the area occupied by the transistor and the capacitor on the semiconductor substrate.

In three dimensional (3-D) memory fabrication, the silicon substrate between the trench capacitors serve as an active area for a transistor. In order to prevent the buried straps (BS), serving as a portion of the transistor drain region, from merging (i.e. BS merge), the neighboring trench capacitors must be separated by a suitable distance. The buried strap is formed by the thermal diffusion of high ion concentrations doped in a conductive layer in the memory cell into the substrate. This is called BS out-diffusion. If the diffusion area of the buried strap is excessive, the merging of buried straps between neighboring trenches may result, inducing short circuiting of the semiconductor memory device. Accordingly, it is difficult to further reduce the size of related devices for increasing device integration.

BRIEF SUMMARY OF INVENTION

A detailed description is given in the following embodiments with reference to the accompanying drawings. A semiconductor memory device and a fabricating method thereof are provided. An embodiment of a method for fabricating a semiconductor memory device comprises providing a substrate having at least a pair of neighboring trench capacitors therein. An insulating layer is formed on the substrate to cover the pair of neighboring trench capacitors. A pair of contact openings is correspondingly formed in the insulating layer to partially expose the pair of neighboring trench capacitors. A pair of connecting structures is formed in the pair of contact openings to allow the pair of connecting structures to electrically connect to the pair of trench capacitors. An active layer is formed on the insulating layer so as to cover the pair of contact openings. A pair of gate structures is formed on the active layer to electrically connect to the pair of trench capacitors.

An embodiment of a semiconductor memory device comprises a substrate having a trench capacitor therein. An insulating layer is disposed on the substrate and covers the trench, wherein the insulating layer has a connecting structure formed therein and above the trench capacitor to electrically connect thereto. An active layer is disposed on the insulating layer to cover the contact connecting structure. A gate structure is disposed on the active layer to electrically connect to the trench capacitor.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The semiconductor memory device and the fabrication method thereof will be described below with reference to the accompanying drawings.

Figure 1A:
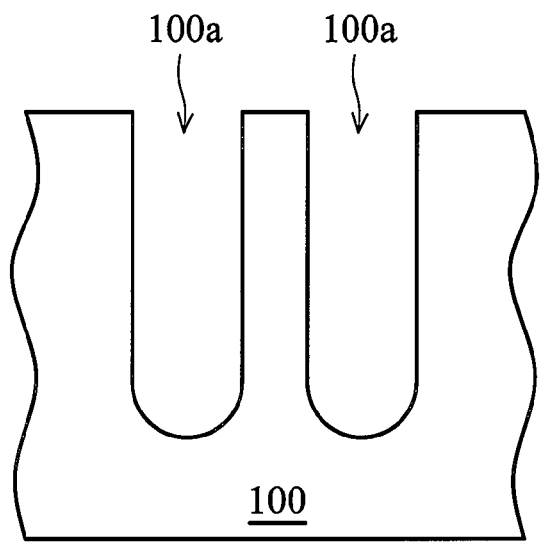
FIGS. 1A to 1J are cross-sections of an embodiment of a method for fabricating a semiconductor memory device.
Figure 1B:
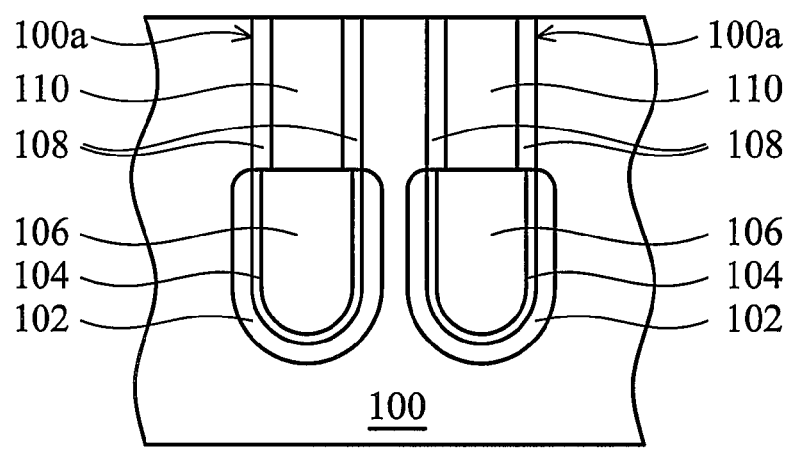
Figure 1C:
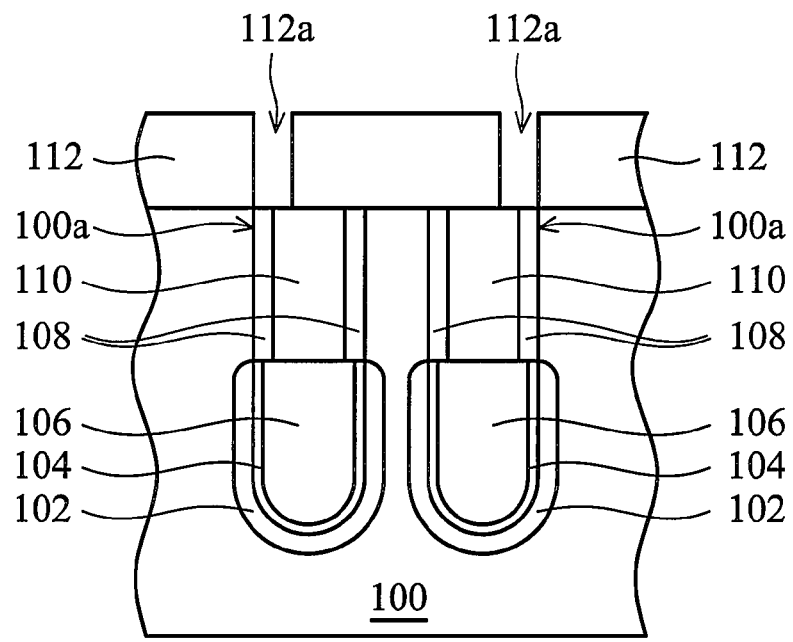
Figure 1D:
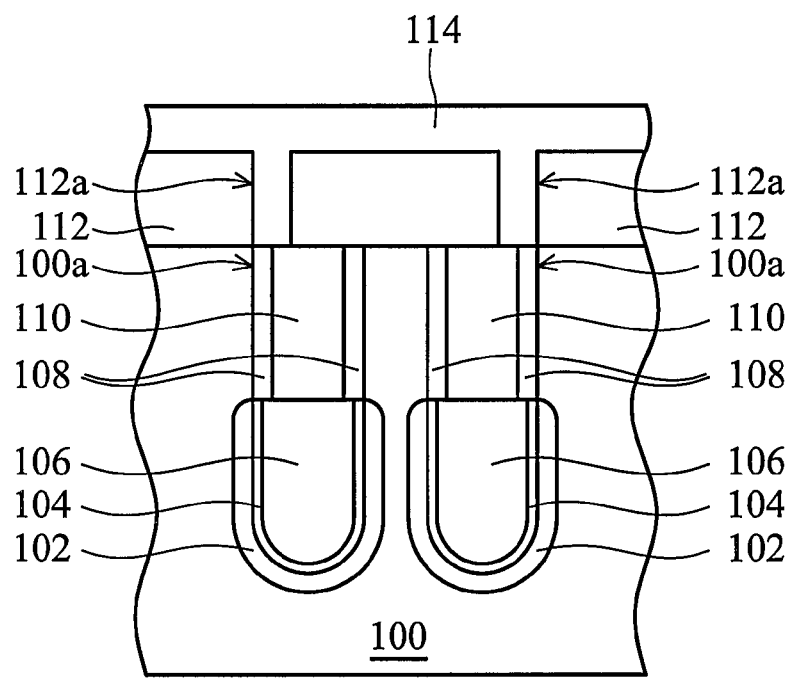
Figure 1E:
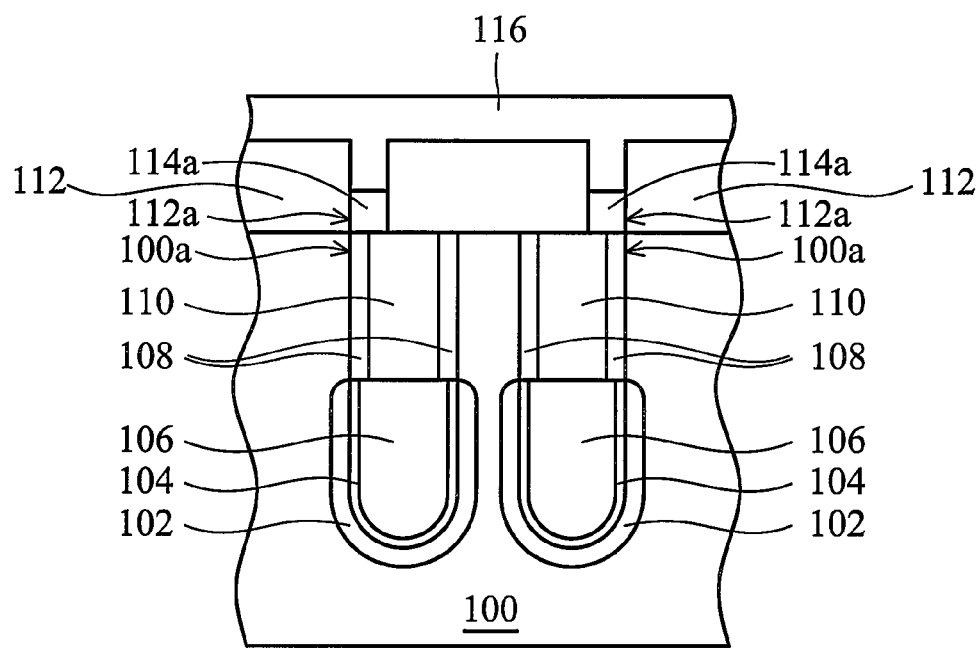
Figure 1F:
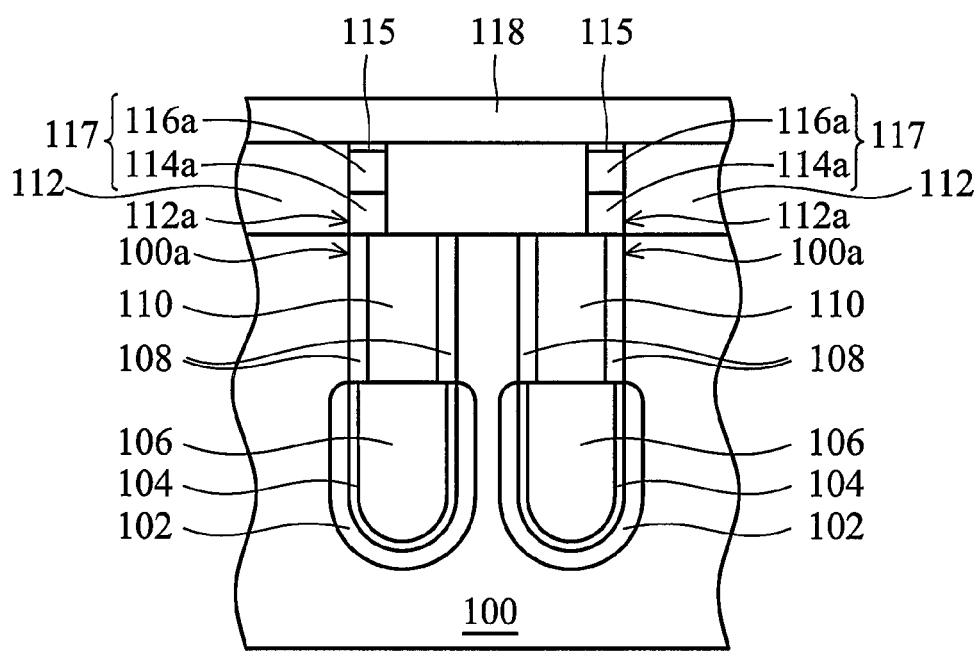
Figure 1G:
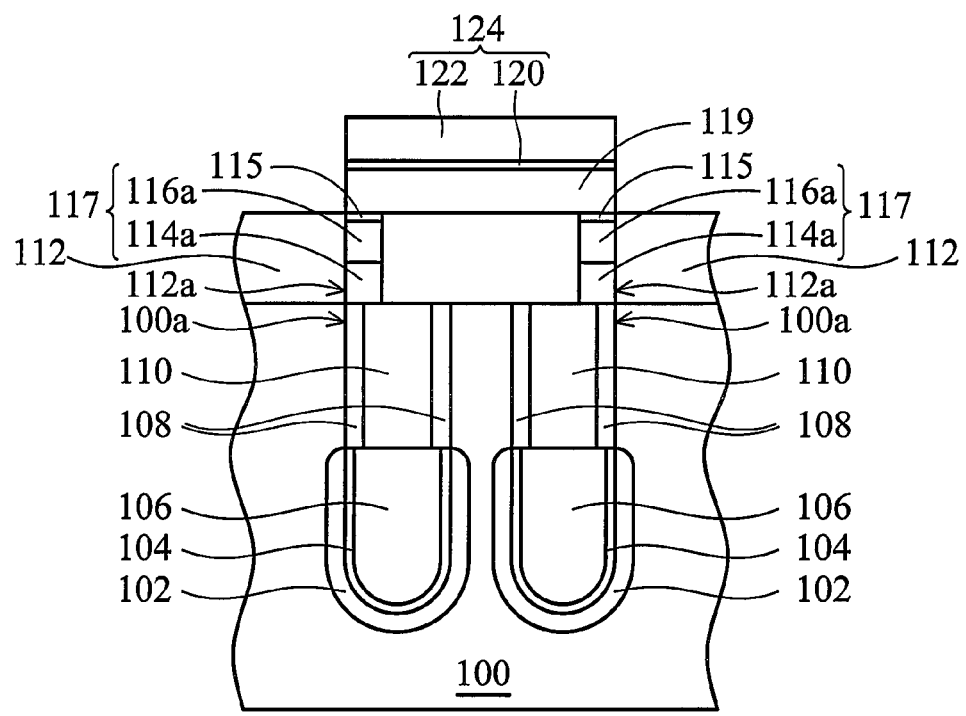
Figure 1H:
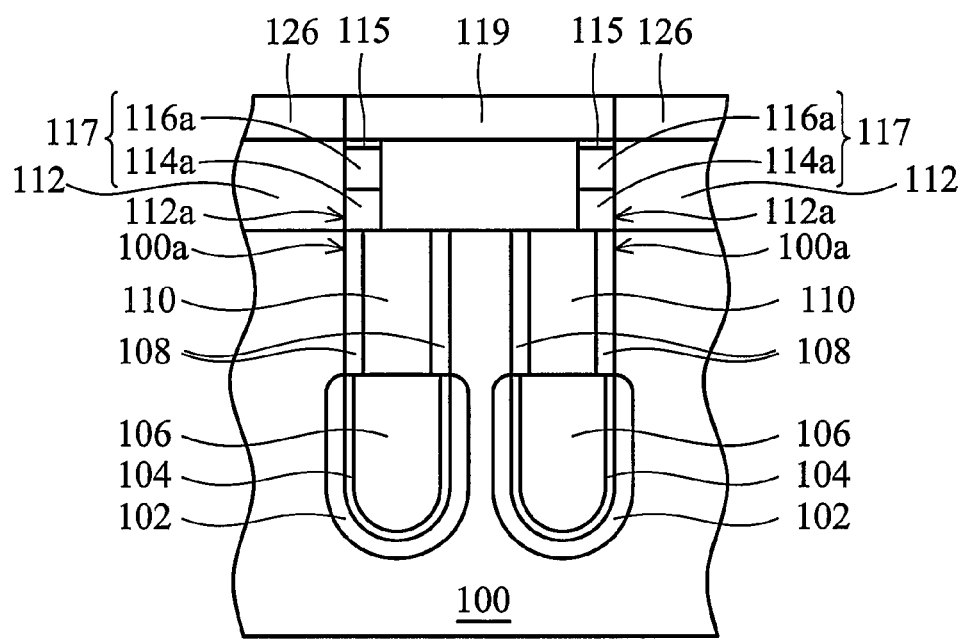
Figure 1I:
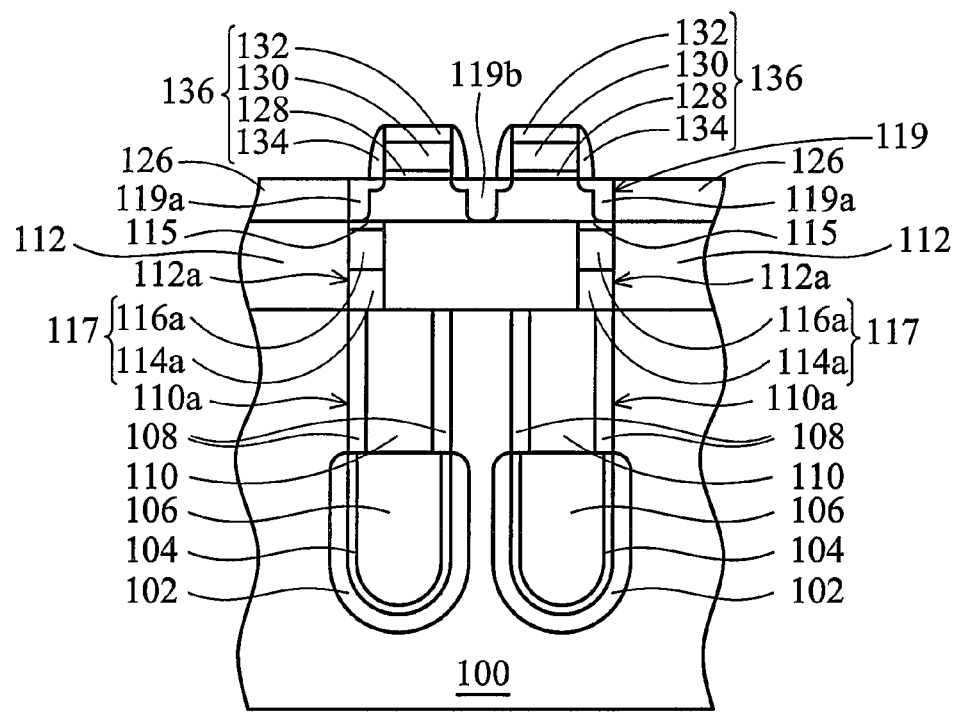
Figure 1J:
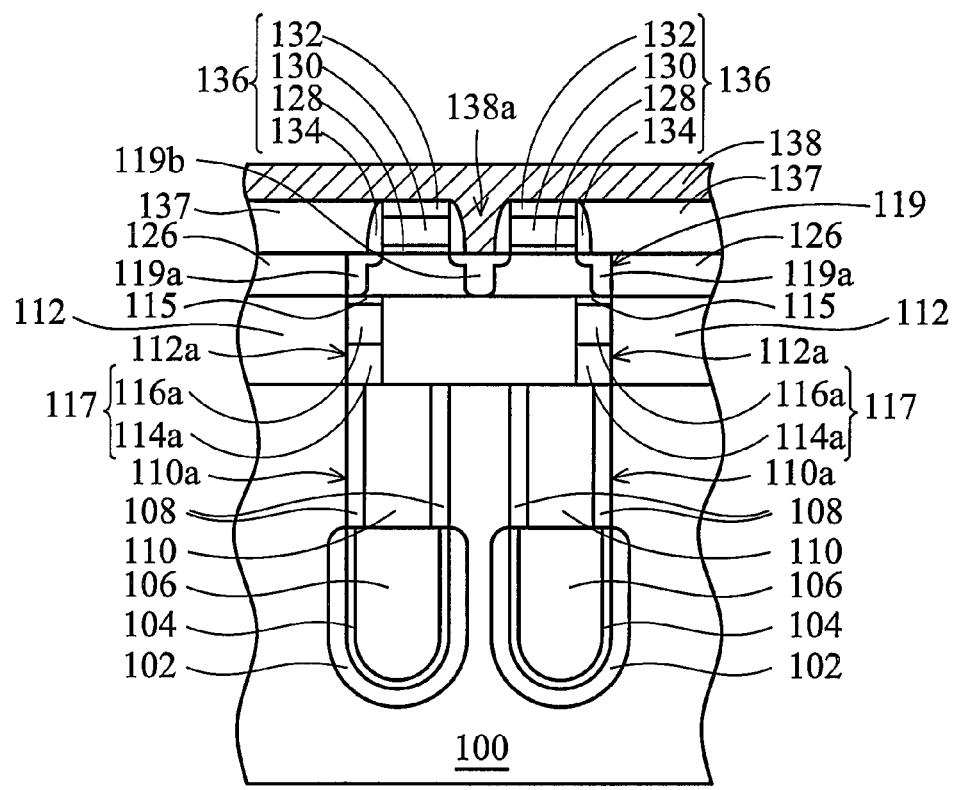

FIG. 1J illustrates an embodiment of a semiconductor memory device, such as a DRAM. The semiconductor memory device comprises: a substrate 100, a pair of buried trench capacitors, first and second insulating layers 112 and 126, a pair of connecting structures 117, an active layer 119, a pair of gate structures 136 and a pair of doping regions 119a. The substrate 100, such as silicon or other semiconductor substrates 100, has at least one pair of neighboring trenches 100a formed therein (as shown in FIG. 1A). The pair of buried trench capacitors is correspondingly disposed in the pair of neighboring trenches 100a. Each buried trench capacitor may comprise a buried lower electrode 102, an upper electrode 106, a capacitor dielectric layer 104 interposed between the electrodes 102 and 106, a collar insulator 108, and a conductor 110, such as a doped polysilicon layer, on the upper electrode 106 and surrounded by the collar insulator 108. In the embodiment, the upper surface of the buried trench capacitor is substantially level with that of the substrate 100.

The first insulating layer 112, such as a silicon oxide layer, is disposed on the substrate 100 and covers each buried trench capacitor. Moreover, the first insulating layer 112 has a pair of contact openings 112a corresponding to the trench 100a to partially expose the underlying conductor 110 of the pair of buried trench capacitors.

The pair of connecting structures 117 is correspondingly disposed in the pair of contact openings 112a and electrically connected to the pair of buried trench capacitors. In the embodiment, each connecting structure 117 may comprise a doped polysilicon layer 114a and an overlying undoped polysilicon layer 116a. Moreover, a pair of buried straps 115 is formed on the corresponding upper surfaces of the undoped polysilicon layers 116a.

The active layer 119, such as an epitaxial silicon layer, is disposed on the first insulating layer 112 between the pair of contact openings 112a and covers the pair of contact openings 112a. The second insulating layer 126, such as a silicon layer, is disposed on the first insulating layer 112 outside the active layer 119. The pair of gate structures 136 is disposed on the active layer 119. The pair of doping regions 119a is formed in the active layer 119 and corresponds to the pair of connecting structures, thereby electrically connecting the buried strap 115 of the connecting structure 117. Thus, the doping region 119a is electrically connected to the buried trench capacitor.

A bit line plug 138a is disposed on the active layer 119 between the pair of gate structures 136 and is electrically connected to a doping region 119b formed in the active layer 119. The doping regions 119a and 119b serve as source/drain regions for transistor(s) of the memory device. Moreover, each gate structure may comprise a gate dielectric layer 128, a gate electrode 130 on the gate dielectric layer 128, a cap layer 132 on the gate electrode 130, and a gate spacer 134 on the sidewall of the gate electrode 130.

FIGS. 1A to 1J are cross-sections of an embodiment of a method for fabricating a semiconductor memory device. As shown in FIG. 1A, a substrate 100, such as silicon or other suitable semiconductor substrates, is provided. The substrate 100 has at least one pair of trenches 100a formed therein. Each trench 100a can be formed by defining the masking layer (not shown) on the substrate 100. For example, the masking layer may comprise a pad oxide layer and an overlying silicon nitride layer.

As shown in FIG. 1B, a pair of buried trench capacitors is correspondingly formed in the pair of trenches 100a by conventional fabrication. Each buried trench capacitor 106 comprises a buried lower electrode 102, an upper electrode 106, a capacitor dielectric layer 104 interposed between the electrodes 102 and 106, a collar insulator 108, and a conductor 110, such as a doped polysilicon layer, on the upper electrode 106 and surrounded by the collar insulator 108. For example, deposition of a doped oxide material, such as arsenic silica glass (ASG), is performed. Next, drive-in process is performed, such that ions in the doped oxide material are out-diffused into the substrate 100 at the lower portion of the trench 100a to form a diffusion region serving as the buried lower electrode 102 of the capacitor. Next, the capacitor dielectric layer 103, which may comprise silicon nitride, oxide-nitride (ON) dual-layers, or oxide-nitride-oxide (ONO) tri-layers, is formed on the sidewall and bottom of the trench 100a. The trench 100a is filled with a doped polysilicon layer 106 and then the doped polysilicon layer 106 is recessed to a predetermined thickness to serve as the capacitor upper electrode. Thereafter, the exposed capacitor dielectric layer 104 above the doped polysilicon layer 106 is removed. An insulating layer 108, such as a silicon oxide layer, may be conformally formed on the substrate 100 and in the trench 100a by chemical vapor deposition (CVD).

Next, the insulating layer 108 on the substrate 100 and the upper electrode 106 is removed by reactive ion etching (RIE), leaving a symmetric collar insulator 108. A conductor 110, such as a doped polysilicon layer, is subsequently formed on the upper electrode 106.

As shown in FIG. 1C, a first insulating layer 112 is formed on the substrate 100. For example, a silicon oxide layer is formed on the substrate 100 by high density plasma chemical vapor deposition (HDPCVD), plasma enhanced CVD (PECVD) or other conventional deposition. The first insulating layer has a thickness of about 500 Å to 5000 Å. Thereafter, a pair of contact openings 112a is formed in the first insulating layer corresponding to the pair of trenches 100a by lithography and etching. The contact opening 112a must expose a portion of the surface of the conductor 110.

As shown in FIG. 1D, a doped polysilicon layer 114 is formed on the first insulating layer and filled the pair of contact openings 112a. In the embodiment, the polysilicon layer 114 can be doped with As or P ions. The doped polysilicon layer 114 is subsequently etched back to remove the doped polysilicon layer 114 on the first insulating layer 112 and portions of the doped polysilicon layer 114 inside the pair of contact openings 112a, thereby leaving a pair of doped polysilicon layers 114a in the pair of contact openings 112a, as shown in FIG. 1E. Afterwards, an undoped polysilicon layer 116 is formed on the first insulating layer 112 and fills the pair of contact openings 112a.

As shown in FIG. 1F, the excess undoped polysilicon layer 116 on the first insulating layer 112 is removed by polishing, such as chemical mechanic polishing (CMP) or by wet or dry etching back process, leaving a pair of undoped polysilicon layers 116a on the pair of doped polysilicon layers 114a and in the pair of contact openings 112a. Additionally, in the embodiment, the undoped polysilicon layer 116a may be transformed to a doped polysilicon with a suitable doping concentration by ions out-diffusion from the doped polysilicon layer 114a during subsequent thermal processes. After forming the pair of undoped polysilicon layers 116a, a pair of buried straps 115 is formed on the surfaces thereof, thus a pair of connecting structures 117 is completed. In the embodiment, the pair of connecting structures 117 is employed to electrically connect to the pair of buried trench capacitors. Additionally, the pair of buried straps 115 can be formed by performing thermal treatment on the surfaces of the pair of undoped polysilicon layers 116a using $NH_3$ as a process gas. After formation of the pair of connecting structures 117, an epitaxial silicon layer 118 is formed on the first insulating layer 112 and covers the pair of contact openings 112a, to serve as an active layer for a transistor. The epitaxial silicon layer 118 may be formed on the first insulating layer 112 by conventional bonding technology. In some embodiments, a silicon seeding layer may be formed on the first insulating layer 112, and then the epitaxial silicon layer 118 may be formed on the first insulating layer 112 by epitaxial growth.

As shown in FIG. 1G, an active layer is formed by defining the epitaxial silicon layer 118 using lithography and etching. For example, a hard mask 124 is formed on the epitaxial silicon layer 118 where an active region is to be formed. In the embodiment, the hard mask 124 may comprise a pad oxide layer 120 and an overlying silicon nitride layer 122. The epitaxial silicon layer 118 unprotected by the hard mask 124 is removed to form an active layer 119 on the first insulating layer 112 between the pair of contact openings 112a and covering the pair of contact openings 112a.

As shown in FIG. 1H, a second insulating layer 126 is formed on the first insulating layer 112 and coplanar with the active layer 119. For example, a silicon layer is formed on the first insulating layer 112 by HDPCVD, PECVD or other conventional deposition. In the embodiment, the second insulating layer 126 serves as an isolation structure for the active layer 119.

As shown in FIG. 1I, a pair of neighboring gate structures 136 is formed on the active layer 119 and corresponds to the pair of the buried trench capacitors. In the embodiment, each gate structure comprises a gate dielectric layer 128, a gate electrode 130 on the gate dielectric layer 128, a cap layer 132 on the gate electrode 130, and a gate spacer 134 on the sidewall of the gate electrode 130. The gate electrode 130 serves as a word line of the memory device. Thereafter, ion implantation is performed to form a pair of doping regions 119a in the active layer 119 corresponding to the pair of connecting structures 117 and simultaneously form another doping region 119b in the active layer 119 between the pair of gate structures 136, in which the pair of doping regions 119a is electrically connected to the pair of connecting structures 117. The doping regions 119a and 119b serve as source/drain regions for transistors. Moreover, doping regions 119a and 119b may comprise lightly doped drain (LDD) regions.

As shown in FIG. 1J, a third insulating layer 137, such as a silicon oxide layer, is formed on the active layer 119 outside the pair of neighboring gate structures 136 and on the second insulating layer 126. Thereafter, a conductive layer 138 is formed on the third insulating layer 137 and the pair of neighboring gate structures 136 and fills the space between the pair of neighboring gate structures 136, in which the conductive layer 138 formed on the third insulating layer 137 and the pair of neighboring gate structures 136 serves as a bit line of the memory device and the conductive layer 138 formed in the space between the pair of neighboring gate structures 136 serves as bit line contact plug 138a.

According to the embodiment, the connecting structure for electrically connecting the transistor and the buried trench capacitor in the memory device is formed above the trench, instead of the conventional diffusion region (i.e. buried strap) formed in the substrate outside the trench. Moreover, the active layer for transistor(s) is formed above the pair of neighboring trenches, instead of the substrate between the trenches for conventional 3D memory devices. Accordingly, as the distance or interval between the neighboring trenches is reduced for further miniaturization, the problems of BS merge and short channel effect can be eliminated. That is, the semiconductor memory device according to the embodiment can effectively increase the integration of integrated circuits.

Although a pair of buried trench capacitors is described by way of example, it should not be taken in a limiting sense. That is, a single buried trench capacitor can have a similar structure as shown in the embodiment by a similar fabrication method.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor memory device, comprising the steps of:
   providing a substrate having at least a pair of neighboring trench capacitors therein;
   forming a first insulating layer on the substrate to cover the pair of neighboring trench capacitors;
   forming a pair of contact openings in the first insulating layer to partially expose the pair of trench capacitors;
   forming a pair of connecting structures in the pair of contact openings to allow the pair of connecting structures to electrically connect to the pair of trench capacitors;
   forming an active layer on the first insulating layer so as to cover the pair of contact openings; and
   forming a pair of gate structures on the active layer to electrically connect to the pair of trench capacitors.

2. The method as claimed in claim 1 further comprising the step of forming a second insulating layer on the first insulating layer to allow the second insulating layer to be coplanar with the first insulating layer.

3. The method as claimed in claim 2 further comprising the step of forming a pair of doping regions in the active layer above the pair of connecting structures, and the pair of doping regions is electrically connected to the pair of connecting structures.

4. The method as claimed in claim 2 further comprising the step of forming a conductor on the active layer, wherein the conductor is positioned between the pair of gate structures.

5. The method as claimed in claim 3, wherein the pair of connecting structures forming step comprises:
   forming a pair of doped polysilicon layers in the pair of contact openings;
   removing a portion of each of the pair of doped polysilicon; and
   forming a pair of undoped polysilicon layers on the pair of doped polysilicon layers to fill the pair of contact openings.

6. The method as claimed in claim 5, wherein after the pair of connecting structures forming step, further comprises forming a pair of buried straps on the surfaces of the pair of undoped polysilicon layers, such that the pair of doping regions is electrically connected to the pair of buried trench capacitors.

7. The method as claimed in claim 4, wherein the active layer comprises epitaxial silicon.

8. The method as claimed in claim 7, wherein each gate structure comprises:
   a gate dielectric layer on a bottom of the gate structure;
   a gate electrode on the gate dielectric layer;
   a cap layer on the gate electrode; and
   a gate spacer on sidewalls of the gate electrode.

9. A semiconductor memory device comprising:
   a substrate having a trench capacitor therein;
   an insulating layer disposed on the substrate and covering the trench capacitor, wherein the insulating layer has a connecting structure formed therein and above the trench capacitor to electrically connect thereto;
   an active layer disposed on the insulating layer to cover the connecting structure;
   a gate structure disposed on the active layer to electrically connect to the trench capacitor;
   a second trench capacitor formed inside the substrate and covered by the insulating layer;
   a second connecting structure formed in the insulating layer and being above the second trench capacitor to allow the second connecting structure to electrically connect to the second trench capacitor, wherein the second connecting structure is covered by the active layer; and
   a second gate structure disposed on the active layer to electrically connect to the second trench capacitor.

10. The memory device as claimed in claim 9 further comprising a first doping region formed in the active layer and being above the connecting structure so that the gate structure is able to electrically connect to the trench capacitor.

11. The memory device as claimed in claim 10 further comprising a second doping region formed in the active layer and being opposed to the first doping region, wherein the first doping region and the second doping region define a channel under the gate structure in the substrate.

12. The memory device as claimed in claim 11, wherein the connecting structure comprises a doped polysilicon layer electrically connected to the trench capacitor, and an undoped polysilicon layer disposed on the doped polysilicon layer and electrically connected to the first doping region.

13. The memory device as claimed in claim 12 further comprising a buried strap formed on top of the undoped polysilicon layer, wherein the buried strap connects the connecting structure to the undoped polysilicon layer.

14. The memory device as claimed in claim 9 further comprising a second doping region formed in the active layer and being above the second connecting structure so that the second gate structure is able to electrically connect to the second trench capacitor.

15. The memory device as claimed in claim 14, wherein the second connecting structure comprises a doped polysilicon layer electrically connected to the second trench capacitor, and an undoped polysilicon layer disposed on the doped polysilicon layer and electrically connected to the second doping region.

16. The memory device as claimed in claim 15 further comprising a buried strap formed on top of the undoped polysilicon layer, wherein the buried strap connects the connecting structure to the undoped polysilicon layer.

17. The memory device as claimed in claim 14 further comprising a third doping region formed in the active layer and being between the first and the second doping region.

18. The memory device as claimed in claim 17 further comprising a conductor formed on the active layer and being between the first and the second gate structure, wherein the conductor is electrically connected to the third doping region.

* * * * *